(12) United States Patent
Zhang et al.

(10) Patent No.: US 11,476,174 B2
(45) Date of Patent: Oct. 18, 2022

(54) SOLDER MASK DESIGN FOR DELAMINATION PREVENTION

(71) Applicant: Intel Corporation, Santa Clara, CA (US)

(72) Inventors: James Zhang, Folsom, CA (US); Yi Xu, Folsom, CA (US); Yuhong Cai, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 841 days.

(21) Appl. No.: 16/177,046

(22) Filed: Oct. 31, 2018

(65) Prior Publication Data

US 2020/0135602 A1     Apr. 30, 2020

(51) Int. Cl.
| | |
|---|---|
| *H01L 23/02* | (2006.01) |
| *H01L 23/31* | (2006.01) |
| *H01L 23/00* | (2006.01) |
| *H01L 25/00* | (2006.01) |
| *H01L 23/538* | (2006.01) |
| *H01L 25/065* | (2006.01) |

(52) U.S. Cl.
CPC ........ *H01L 23/3128* (2013.01); *H01L 23/538* (2013.01); *H01L 24/17* (2013.01); *H01L 24/32* (2013.01); *H01L 25/0657* (2013.01); *H01L 25/50* (2013.01); *H01L 2224/32054* (2013.01); *H01L 2224/32057* (2013.01); *H01L 2924/35121* (2013.01)

(58) Field of Classification Search
CPC ... H01L 23/3128; H01L 23/538; H01L 24/17; H01L 24/32; H01L 25/0657; H01L 25/50; H01L 2224/32054; H01L 2224/32057; H01L 2924/35121
USPC .......................... 257/678, 772, 783; 438/118
See application file for complete search history.

(56) References Cited

U.S. PATENT DOCUMENTS

| | | | | |
|---|---|---|---|---|
| 9,748,193 B2* | 8/2017 | Kim | ...................... | H05K 3/3452 |
| 10,448,508 B2* | 10/2019 | Park | ........................ | H01L 24/00 |
| 11,101,190 B2* | 8/2021 | Tsao | .................... | H01L 23/3114 |
| 2020/0118990 A1* | 4/2020 | Xu | ....................... | H01L 23/5386 |

\* cited by examiner

*Primary Examiner* — Luan C Thai
(74) *Attorney, Agent, or Firm* — Schwabe, Williamson & Wyatt, P.C.

(57) ABSTRACT

Embodiments described herein provide techniques for forming a solder mask having a repeating pattern of features formed therein. The repeating pattern of features can be conceptually understood as a plurality of groove structures formed in the solder mask. The solder mask can be included in a semiconductor package that comprises the solder mask over a substrate and a molding compound over the solder mask that conforms to the repeating pattern of features. Several advantages are attributable to embodiments of the solder mask described herein. One advantage is that the repeating pattern of features formed in the solder mask increase the contact area between the solder mask and the molding compound. Increasing the contact area can assist with increasing adherence and conformance of the molding compound to the solder mask. This increased adherence and conformance assists with minimizing or eliminating interfacial delamination.

25 Claims, 6 Drawing Sheets

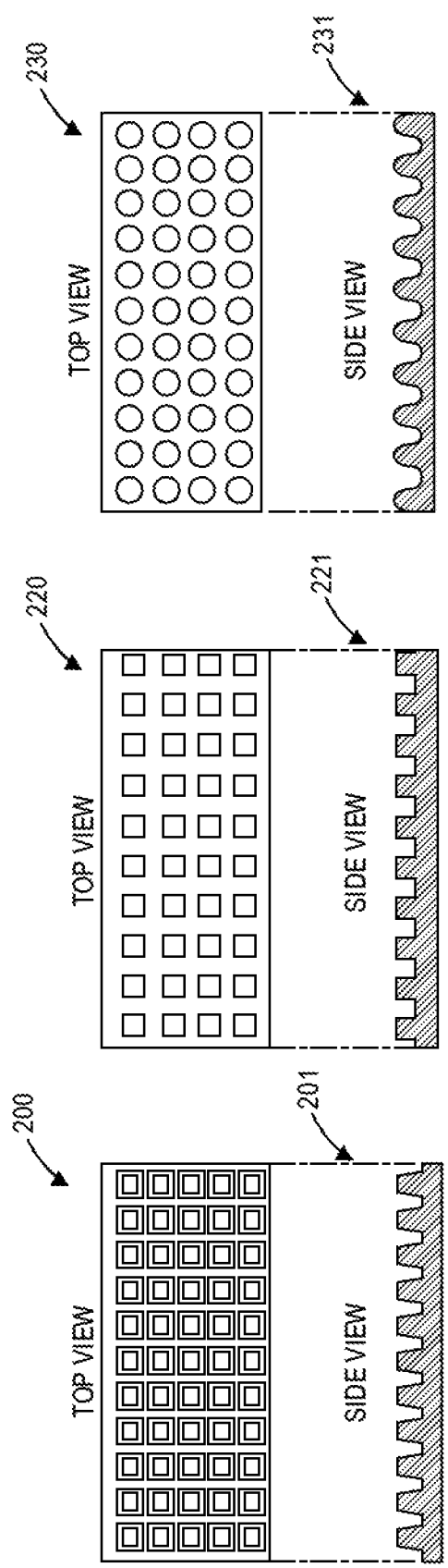

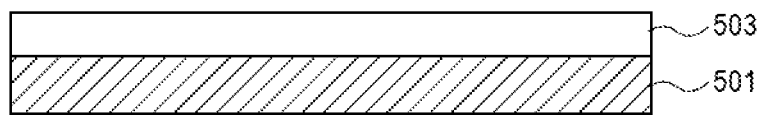
FIG. 5A
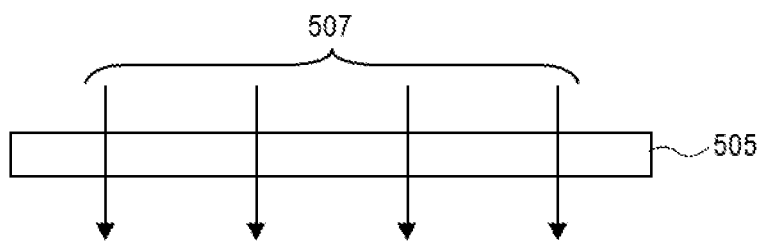
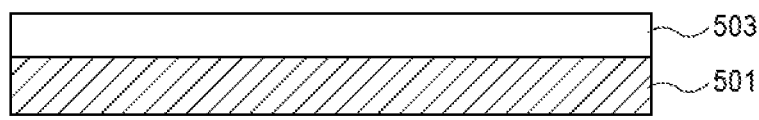
FIG. 5B
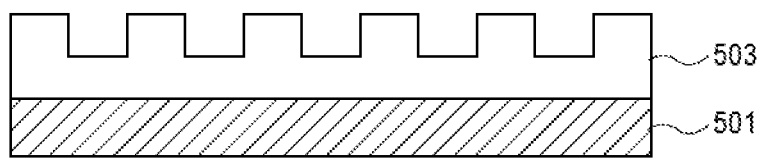
FIG. 5C

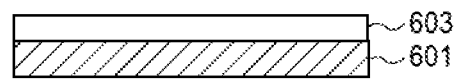
FIG. 6A
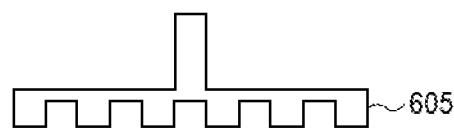
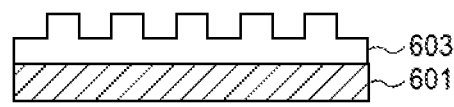
FIG. 6B
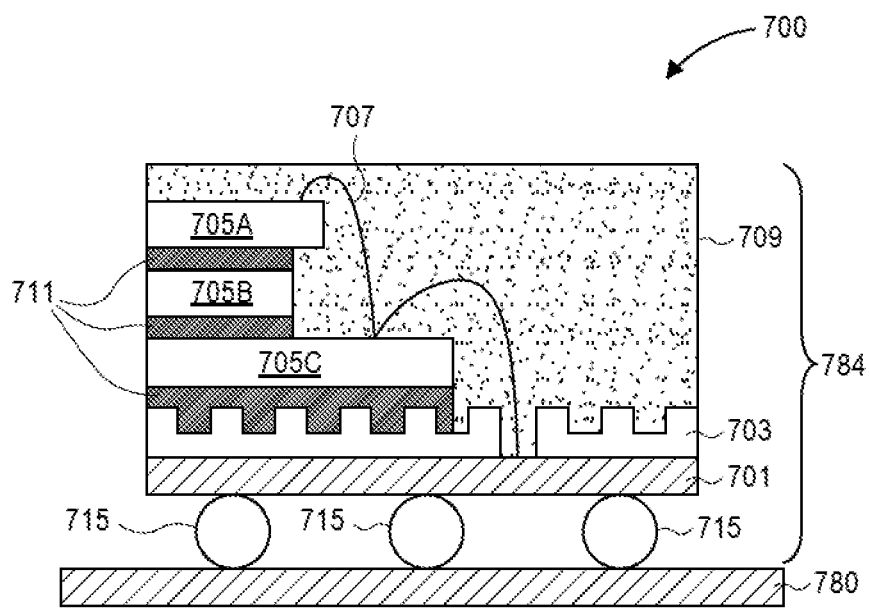
FIG. 7

SOLDER MASK DESIGN FOR DELAMINATION PREVENTION

BACKGROUND

Field

Embodiments described herein generally relate to substrates (e.g., semiconductor packages, printed circuit boards (PCB), etc.). More particularly, but not exclusively, embodiments described herein relate to a solder mask that is on or part of a substrate.

Background Information

As the number of dies in a semiconductor package increase and the size of the semiconductor package reduces, there is an increased risk of stress within the semiconductor package. Stress within a semiconductor package is caused by mismatches between the coefficients of thermal expansion (CTEs) of the different materials used to fabricate the semiconductor package. Stress within a semiconductor package can cause interfacial delamination between a die and a molding compound or between a substrate and a molding compound.

In a semiconductor package, adherence of a solder mask to a molding compound (e.g., an epoxy molding compound (EMC), etc.) encapsulating the solder mask and the dies on a substrate is critical to preventing interfacial delamination. However, as semiconductor packages are reduced in size, the contact area between the solder mask and the molding compound is reduced. Accordingly, the adhesion between the solder mask and the molding compound is negatively impacted. This reduced adhesion contributes to interfacial delamination (e.g., interfacial delamination at the edges of a package, etc.).

One technique of increasing the contact area between the solder mask and the molding compound is to increase the size of the package so that the risk of interfacial delamination is minimized or eliminated. This solution, however, results in unwanted increases in the size of a package and unwanted reductions in I/O densities of the package. Consequently, at least one technique of reducing interfacial delamination remains suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 2A-2C illustrates top views and cross sectional side views of a solder mask, according to several embodiments.

FIGS. 5A-5C illustrate a process of forming a plurality of features in a light sensitive solder mask.

FIGS. 6A-6B illustrate a process of forming a plurality of features in a solder mask.

FIG. 7 is a cross sectional side view illustration of packaged system, in accordance with one embodiment

DETAILED DESCRIPTION

Figure 1A:
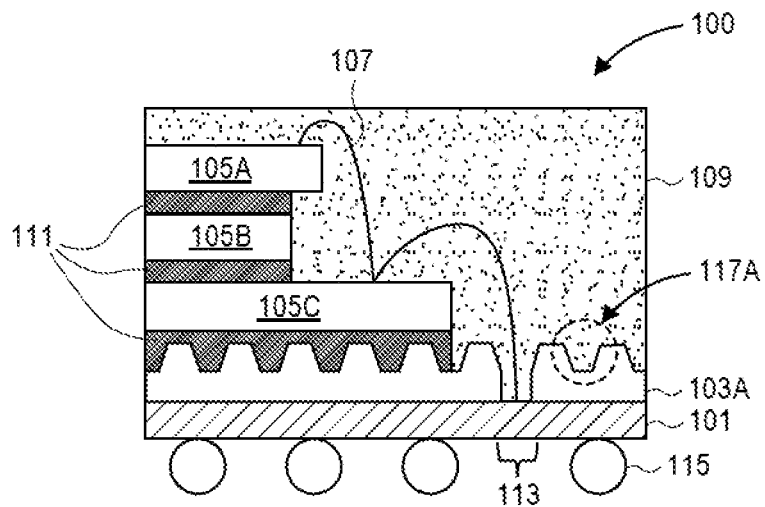
FIGS. 1A-1C illustrate cross sectional side views of semiconductor packages, according to several embodiments.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein provide techniques for forming a solder mask. In one embodiment, the solder mask has a repeating pattern of features formed therein. The repeating pattern of features can be conceptually understood as a plurality of groove structures formed in the solder mask. A groove structure can have any shape or profile. Groove structures are described in further detail below in connection with one or more of FIGS. 1A-8. The solder mask can be included in a semiconductor package that comprises the solder mask over a substrate and a molding compound over the solder mask that conforms to the repeating pattern of features.

Several advantages are attributable to embodiments of the solder mask described herein. One advantage is that the repeating pattern of features formed in the solder mask increase the contact area between the solder mask and the molding compound (when compared to the contact area between a solder mask lacking the repeating pattern of features and the molding compound). Increasing the contact area can assist with increasing adherence and conformance of the molding compound to the solder mask. This increased adherence and conformance assists with minimizing interfacial delamination, which can assist with reducing costs associated with semiconductor packaging, reducing complexities of processes associated with semiconductor packaging, reducing sizes of semiconductor packages, and increasing input/output (I/O or IO) densities of packages.

Figure 1B:
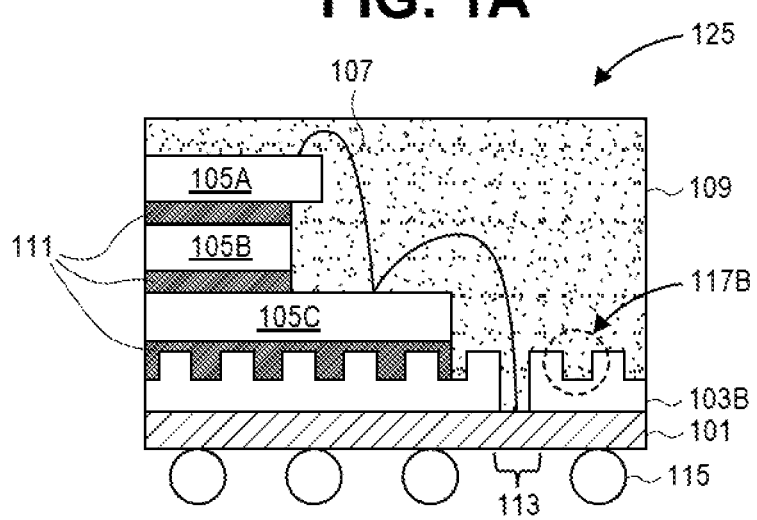
Figure 1C:
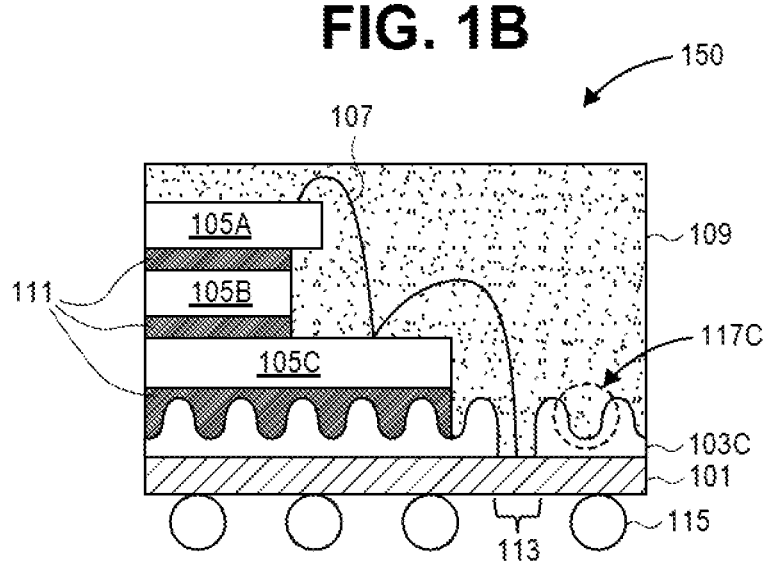

FIGS. 1A-1C illustrate cross sectional side views of semiconductor packages 100, 125, 150, according to several embodiments. With regard now to FIG. 1A, a semiconductor package 100 is shown. The package 100 comprises a substrate 101, interconnects 115, a solder mask 103A having a repeating pattern of features and a solder resist opening (SRO) 113 formed therein, a stack of dies 105A-C, die attach films 111, an interconnect 107, and a molding compound 109.

The substrate 101 can be any known substrate. For example, the substrate 101 can be a silicon substrate, an organic substrate, a ceramic substrate, any other known organic or inorganic substrate known in the art, or any combination thereof. In an embodiment, substrate 101 includes metal traces, such as copper traces.

At least one of the interconnects 115 can be a ball, a bump, a micro bump or any other interconnect structure capable of electrically and physically coupling the substrate 101 and another device. The other device can be another substrate (e.g., another semiconductor package, a board (e.g., a printed circuit board (PCB), an interposer, etc.). The interconnects 115 can be formed from solder or any other suitable material or combination of materials known in the art.

The stack of dies 105A-105C comprises multiple dies stacked on top one another. Each of the dies 105A-105C is physically coupled to another one of the dies 105A-105C using a die attach film 111, with the die 105C being physically coupled to the solder mask 103A by a die attach film 111. The die attach film 111 used to couple the die 105C to the solder mask 103A conforms to the repeating pattern of features in the solder mask 103A. The embodiment of the package 100 shown in FIG. 1A includes three dies 105A-105C. Other embodiments, however, are not so limited. That is, the package 100 may include any number of dies. In another embodiment, the package 100 includes one die.

The interconnect 107 can be any suitable interconnect capable of electrically coupling the dies 105A-105C to each other and/or to the substrate 101. The solder mask 103A includes an SRO 113 that reveals an electrical feature formed in or on the substrate 101. The electrical feature may be a pad, a trace, any other electrical feature or combination thereof as is known in the art (e.g., an inductor, a capacitor, etc.). In this way, the SRO 113 enables the interconnect 107 to electrically couple the dies 105A-105C to the substrate 101. The interconnect 107 can, for example, be a wire bond that electrically couples: (i) the dies 105A-105C to each other; and/or (ii) the dies 105A-105C to the substrate 101. Although the package 100 is shown in FIG. 1A to include only one SRO 113 formed in the solder mask 103A, it is to be appreciated that a plurality of SROs may be formed in the solder mask 103A.

A molding compound 109 encapsulates the dies 105A-105C, the die attach film 111, the solder mask 103A, and the wire bond 107. As used herein, the term "encapsulating" does not require all sides of a component or device to be covered by an encapsulating material. For example, a top surface of the uppermost die 105A may not be encapsulated by the molding compound 109. Other embodiments, however, are not so limited. That is, all lateral and top sides of a component or device may be covered by an encapsulating material 109.

With specific regard to the solder mask 103A, a repeating pattern of features are formed in the solder mask 103A. As shown in FIG. 1A, the repeating pattern of features are formed as groove structures 117A. For one embodiment, a groove structure 117A is a trench that is characterized by a bottom wall and two side walls, where the side walls are opposite each other and physically coupled to each other by the bottom wall. The bottom wall can be substantially horizontal, slanted, or curved. The side walls can be substantially vertical, sloped, or curved. Examples of trenches include, but are not limited to, a tapered trench having a decreasing distance between two sidewalls, a rectilinear trench having a substantially uniform distance between two sidewalls, a curvilinear trench having a curved surface or sidewall, etc. The repeating pattern of features in the solder mask 103A can be formed using a roller, a stamp, or a photolithography technique. The repeating pattern of features formed in the solder mask 103A increase the contact area between the solder mask 103A and the molding compound 109 (when compared to the contact area between a conventional solder mask lacking the repeating pattern of features and the molding compound). Increasing the contact area can assist with increasing adherence and conformance of the molding compound 109 to the solder mask 103A. This increased adherence and conformance assists with minimizing interfacial delamination, which can in turn assist with reducing costs associated with semiconductor packaging, reducing complexities of processes associated with semiconductor packaging, reducing sizes of semiconductor packages, and increasing input/output (I/O or JO) densities of packages.

As shown in FIG. 1A, the repeating pattern of the solder mask 103A is one the entirety of the substrate 101. Other embodiments, however, are not so limited. In one alternate embodiment, the repeating pattern of the solder mask 103A may be formed in portions of the solder mask 103A lacking a component (e.g., die stacks 105A-105C, etc.) on the solder mask 103A. For example, and with regard to FIG. 1A, the solder mask 103A may include: (i) a first portion under the die stack 105A-105C that does not include the repeating pattern (e.g., the first portion has a flat surface, etc.); and (ii) a second portion that is not under the die stack 105A-105C and that includes the repeating pattern. For yet another embodiment, the repeating pattern of solder mask 103A may surround components (e.g., the die stack 105A, etc.) on the solder mask 103A.

In one embodiment, the solder mask 103A is formed from a resist material or a polymer. The material used to form the mask 103A can be in liquid form, film form, any other suitable form, or any combination thereof. The resist material can, for example, comprise a photoresist material, a photoimageable dielectric (PID), any other suitable light sensitive material used to form solder masks as is known in the art, or any combination thereof. Specific examples of materials used to form solder masks include, but are not limited to, an epoxy liquid, a liquid photoimageable solder mask (LPSM), a liquid photoimageable ink (LPI), and a dry film photoimageable solder mask (DFSM).

Moving on to FIG. 1B, a semiconductor package 125 is shown. The semiconductor package 125 is similar to or the same as the semiconductor package 100 described above in connection with FIG. 1A, with the exception that the solder mask 103B differs from the solder mask 103A. That is, the solder mask 103B's repeating pattern of features are formed as groove structures 117B, which are rectilinear trenches that each have a substantially uniform distance between two sidewalls.

Referring now to FIG. 1C, a semiconductor package 150 is shown. The semiconductor package 150 is similar to or the same as the semiconductor package 100 described above in connection with FIG. 1A, with the exception that the solder mask 103C differs from the solder mask 103A. That is, the solder mask 103C's repeating pattern of features are formed as groove structures 117C, which are curvilinear trenches that each have a curved sidewall.

It is to be appreciated that the groove structures 117A-117C described above in connection with FIGS. 1A-1C are illustrative and not exhaustive. For example, the groove structures can have a stepped profile, where the side walls are formed as steps.

FIGS. 2A-2C illustrate top views 200, 220, 230 and cross sectional side views 201, 221, 231 of a solder mask, according to several embodiments. With regard now to FIG. 2A, a top view 200 and a cross sectional side view 201 of a solder mask is shown. The solder mask shown in FIG. 2A has a repeating pattern of features formed therein. The features shown in views 200 and 201 are groove structures in the form of tapered trenches. Referring now to FIG. 2B, a top view 220 and a cross sectional side view 221 of a solder mask is shown. The solder mask shown in FIG. 2B has a repeating pattern of features formed therein. The features shown in views 220 and 221 are groove structures in the form of rectilinear trenches. Moving on to FIG. 2C, a top view 230 and a cross sectional side view 231 of a solder mask is shown. The solder mask shown in FIG. 2C has a repeating pattern of features formed therein. The features shown in views 230 and 231 are groove structures in the form of curvilinear trenches.

Figure 3A:
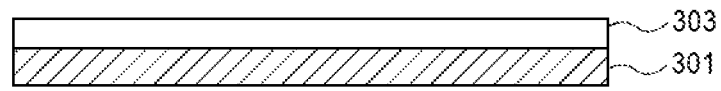
FIGS. 3A-3B illustrate a process of forming a plurality of features in a solder mask on a substrate.
Figure 3B:
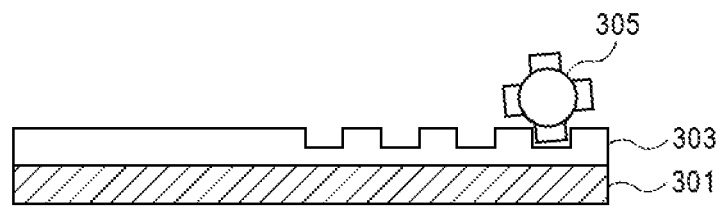

FIGS. 3A-3B illustrate a process of forming a plurality of features in a solder mask 303 on a substrate 301. In FIG. 3A, a solder mask 303 is applied onto a substrate 301. Next, in FIG. 3B, a roller 305 having a pattern formed thereon is applied or pressed on the solder mask 303 to transfer a repeating pattern of features into the solder mask 303. In one embodiment, the roller 305 is similar to or the same as a rotary printing press in which the pattern to be formed in the solder mask 303 is curved around a cylinder. The solder mask 303 can be similar to or the same as the solder mask 103A described above in connection with FIG. 1A. The substrate 301 can be similar to or the same as the substrate 101 described above in connection with FIG. 1A.

Figure 4:
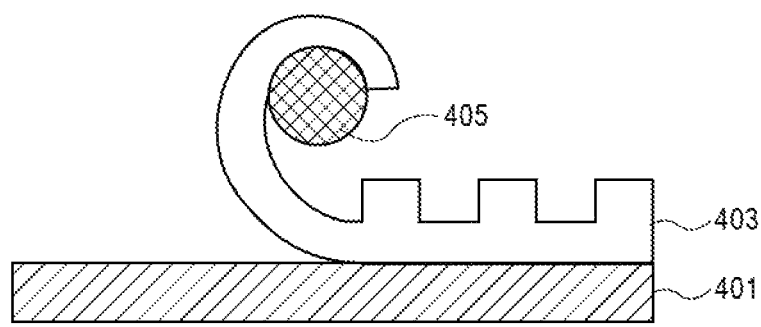
FIG. 4 illustrates a process of forming a plurality of features in a solder mask on a substrate.

FIG. 4 illustrates a process of forming a plurality of features in a solder mask 403 on a substrate 401. In FIG. 4, the solder mask 403 is applied to or pressed onto the substrate 401 by unwinding the solder mask 403 from a roller 405 having a pattern formed thereon. In this way, the roller 405 transfers a repeating pattern of features into the solder mask 403. In one embodiment, the roller 405 is similar to a rotary printing press in which the pattern to be formed in the solder mask 403 is curved around a cylinder. The solder mask 403 can be similar to or the same as the solder mask 103A described above in connection with FIG. 1A. The substrate 401 can be similar to or the same as the substrate 101 described above in connection with FIG. 1A.

FIGS. 5A-5C illustrate a process of forming a plurality of features in a light sensitive solder mask 503 on a substrate 501. First, in FIG. 5A, a light sensitive solder mask 503 is applied onto a substrate 501. The solder mask 503 can be formed from any suitable light sensitive material (e.g., photoresist, PID, etc.). The solder mask 503 can be similar to or the same as the solder mask 103A described above in connection with FIG. 1A. The substrate 501 can be similar to or the same as the substrate 101 described above in connection with FIG. 1A.

Next, in FIG. 5B, the light sensitive solder mask 503 is lithographically patterned using light 507 and a mask 505. After exposure to the light 507 via the mask 505, a developer is applied to remove (un)exposed portions of the solder mask 503 so as to reveal a plurality of features formed in the solder mask 503, as shown in FIG. 5C.

FIGS. 6A-6B illustrate a process of forming a plurality of features in a solder mask 603 on a substrate 601. In FIG. 6A, a solder mask 603 is applied onto a substrate 601. Next, in FIG. 6B, a stamp 605 having a pattern formed thereon is pressed or applied on the solder mask 603 to transfer a repeating pattern of features into the solder mask 603. The solder mask 603 can be similar to or the same as the solder mask 103A described above in connection with FIG. 1A. The substrate 601 can be similar to or the same as the substrate 101 described above in connection with FIG. 1A.

FIG. 7 is a cross sectional side view illustration of packaged system 700 comprising a solder mask 703 having a repeating pattern of features formed therein, in accordance with one embodiment. In an embodiment, the packaged system 700 may include a semiconductor package 784. The package 784 comprises components that are similar to or the same as the components described above in connection with the package 100 shown in FIG. 1A. For brevity, these components are not described again.

In an embodiment, the packaged system 700 may include the semiconductor package 784 electrically coupled to a board 780 (e.g., a PCB, etc.) with solder bumps 715 and any other suitable interconnect architecture, such as wire bonding, ball grid array, pin grid array, land grid array, or the like.

Figure 8:
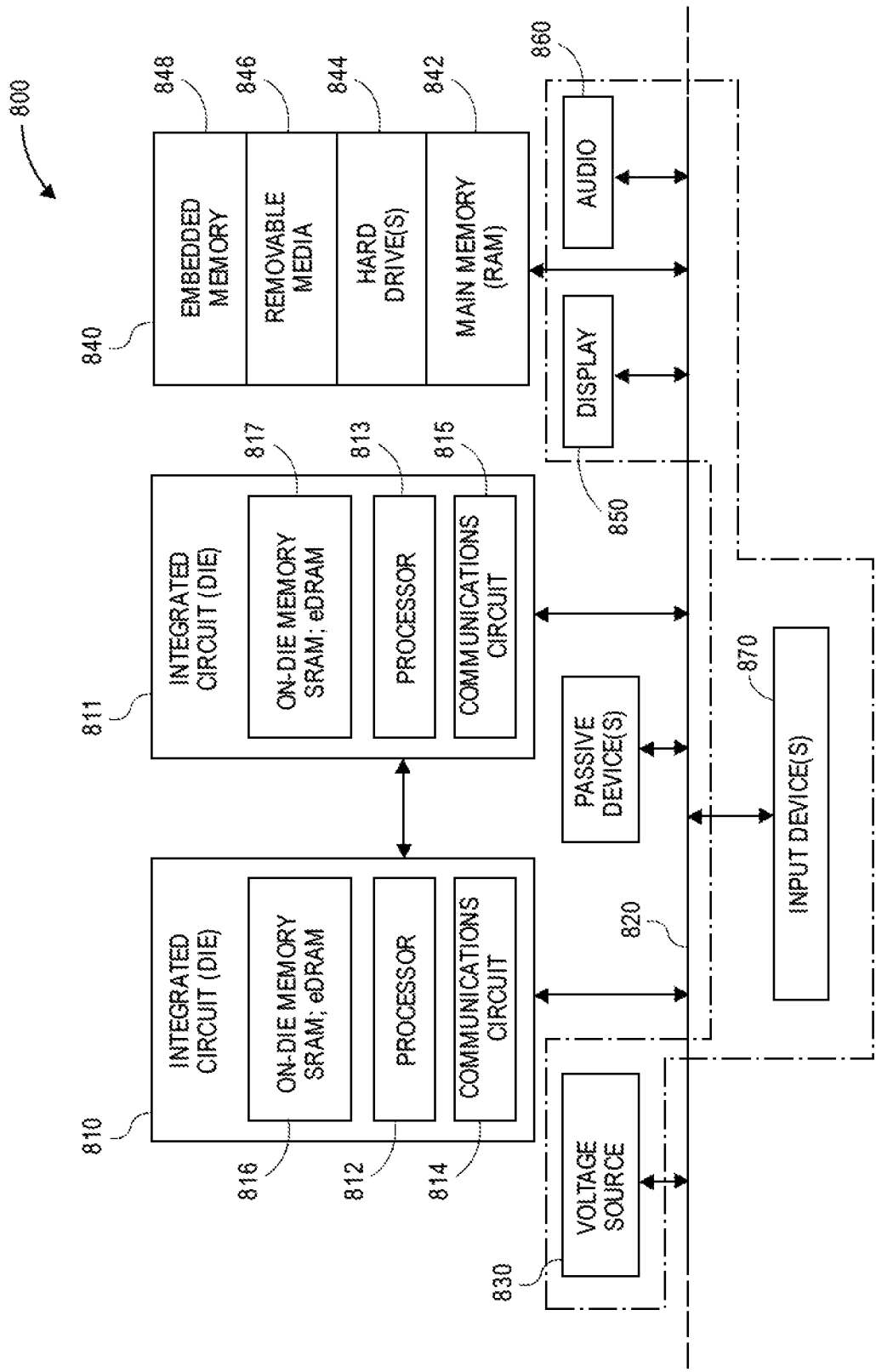
FIG. 8 illustrates a schematic of computer system 800 according to an embodiment.

FIG. 8 illustrates a schematic of computer system 800 according to an embodiment.

The computer system 800 (also referred to as an electronic system 800) can include a semiconductor package comprising a solder mask having a repeating pattern of features formed therein in accord with any of the embodiments and their equivalents as set forth in this disclosure. The computer system 800 may be a mobile device, a netbook computer, a wireless smart phone, a desktop computer, a hand-held reader, a server system, a supercomputer, or a high-performance computing system.

The system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In one embodiment, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812. As used herein, the processor 812 may mean any type of circuit such as, but not limited to, a microprocessor, a microcontroller, a graphics processor, a digital signal processor, or another processor. In an embodiment, the processor 812 includes, or is coupled with, a semiconductor package comprising a solder mask having a repeating pattern of features formed therein in accordance with any of the embodiments and their equivalents, as described in the foregoing specification. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM). In one embodiment, the on-die memory 816 may be packaged with a process in accordance with any of the embodiments and their equivalents, as described in the foregoing specification.

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850 and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

At least one of the integrated circuits 810 or 811 can be implemented in a number of different embodiments, including a semiconductor package comprising a solder mask having a repeating pattern of features formed therein as described herein, an electronic system, a computer system, one or more methods of fabricating an integrated circuit, and one or more methods of fabricating a semiconductor package comprising a solder mask having a repeating pattern of features formed therein, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a stress absorption material in accordance with any of the disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Embodiments described herein include a semiconductor package, comprising: a substrate; a solder mask over the substrate, the solder mask having a repeating pattern of features formed into the solder mask; and a molding compound over the solder mask, the molding compound conforming to the repeating pattern of features.

Additional embodiments include a semiconductor package, further comprising a die stack on the solder mask.

Additional embodiments include a semiconductor package, wherein the die stack is attached to the solder mask with a die attach film and wherein the die attach film conforms to the repeating pattern of features.

Additional embodiments include a semiconductor package, wherein the repeating pattern of features comprises a plurality of trenches formed into the solder mask.

Additional embodiments include a semiconductor package, wherein a trench has sidewalls and a bottom wall.

Additional embodiments include a semiconductor package, wherein the sidewalls are sloped sidewalls.

Additional embodiments include a semiconductor package, wherein the sidewalls are substantially vertical sidewalls.

Additional embodiments include a semiconductor package, wherein the bottom wall is a slanted bottom wall.

Additional embodiments include a semiconductor package, wherein the bottom wall is a substantially horizontal bottom wall.

Additional embodiments include a semiconductor package, wherein the repeating pattern of features comprises a plurality of curvilinear trenches formed into the solder mask.

Additional embodiments include a semiconductor package, wherein a curvilinear trench has a curved surface.

Embodiments described herein include a packaged system, comprising: a semiconductor package on a printed circuit board, the semiconductor package comprising: a stack of dies on a solder mask; the solder mask over a substrate, the solder mask having a repeating pattern of features formed into the solder mask; and a molding compound over the solder mask, the molding compound conforming to the repeating pattern of features.

Additional embodiments include a packaged system, wherein the solder mask has a solder resist opening (SRO) formed therein.

Additional embodiments include a packaged system, wherein an interconnect passes through the SRO to couple the stack of dies to the substrate.

Additional embodiments include a packaged system, wherein a die attach film couples the stack of dies to the solder mask and wherein the die attach film conforms to the solder mask.

Additional embodiments include a packaged system, wherein each feature is a groove structure formed in the solder mask.

Additional embodiments include a packaged system, wherein each groove structure is a tapered trench.

Additional embodiments include a packaged system, wherein each groove structure is a rectilinear trench.

Additional embodiments include a packaged system, wherein each groove structure is a curvilinear trench.

Embodiments described herein include a method of forming a semiconductor package, comprising forming a repeating pattern of features into a solder mask on a substrate.

Additional embodiments include a method, wherein forming the repeating pattern of features into the solder mask on the substrate comprises: applying a roller onto the solder mask, the roller having the repeating pattern, wherein the repeating pattern is transferred into the solder mask.

Additional embodiments include a method, wherein forming the repeating pattern of features into the solder mask on the substrate comprises: applying the solder mask onto the substrate by unwinding the solder mask from a roller having the repeating pattern formed thereon, wherein the repeating pattern is transferred into the solder mask.

Additional embodiments include a method, wherein forming the repeating pattern of features into the solder mask on the substrate comprises: lithographically patterning the solder mask to form the repeating pattern therein, wherein the solder mask is formed from a light sensitive material.

Additional embodiments include a method, wherein the light sensitive material comprises a photoresist or a photo-imageable dielectric.

Additional embodiments include a method, wherein forming the repeating pattern of features into the solder mask on the substrate comprises: pressing a stamp into the solder mask, the stamp having the repeating pattern, wherein the repeating pattern is transferred into the solder mask.

The invention claimed is:

1. A semiconductor package, comprising:
a substrate;
a solder mask over the substrate, the solder mask having a repeating pattern of features formed into the solder mask, the repeating pattern of features extending partially into the solder mask; and
a molding compound over the solder mask, the molding compound conforming to the repeating pattern of features.

2. The semiconductor package of claim 1, further comprising a die stack on the solder mask.

3. The semiconductor package of claim 2, wherein the die stack is attached to the solder mask with a die attach film and wherein the die attach film conforms to the repeating pattern of features.

4. The semiconductor package of claim 1, wherein the repeating pattern of features comprises a plurality of trenches formed into the solder mask.

5. The semiconductor package of claim 4, wherein a trench has sidewalls and a bottom wall.

6. The semiconductor package of claim 5, wherein the sidewalls are sloped sidewalls.

7. The semiconductor package of claim 5, wherein the sidewalls are substantially vertical sidewalls.

8. The semiconductor package of claim 5, wherein the bottom wall is a slanted bottom wall.

9. The semiconductor package of claim 5, wherein the bottom wall is a substantially horizontal bottom wall.

10. The semiconductor package of claim 1, wherein the repeating pattern of features comprises a plurality of curvilinear trenches formed into the solder mask.

11. The semiconductor package of claim 10, wherein a curvilinear trench has a curved surface.

12. A packaged system, comprising:
a semiconductor package on a printed circuit board, the semiconductor package comprising:
a stack of dies on a solder mask;
the solder mask over a substrate, the solder mask having a repeating pattern of features formed into the solder mask, the repeating pattern of features extending partially into the solder mask; and
a molding compound over the solder mask, the molding compound conforming to the repeating pattern of features.

13. The packaged system of claim 12, wherein the solder mask has a solder resist opening (SRO) formed therein.

14. The packaged system of claim 13, wherein an interconnect passes through the SRO to couple the stack of dies to the substrate.

15. The packaged system of claim 12, wherein a die attach film couples the stack of dies to the solder mask and wherein the die attach film conforms to the solder mask.

16. The packaged system of claim 12, wherein each feature is a groove structure formed in the solder mask.

17. The packaged system of claim 16, wherein each groove structure is a tapered trench.

18. The packaged system of claim 16, wherein each groove structure is a rectilinear trench.

19. The packaged system of claim 16, wherein each groove structure is a curvilinear trench.

20. A method of forming a semiconductor package, comprising:
forming a repeating pattern of features into a solder mask on a substrate, the repeating pattern of features extending partially into the solder mask.

21. The method of claim 20, wherein forming the repeating pattern of features into the solder mask on the substrate comprises:
applying a roller onto the solder mask, the roller having the repeating pattern, wherein the repeating pattern is transferred into the solder mask.

22. The method of claim 20, wherein forming the repeating pattern of features into the solder mask on the substrate comprises:
applying the solder mask onto the substrate by unwinding the solder mask from a roller having the repeating pattern formed thereon, wherein the repeating pattern is transferred into the solder mask.

23. The method of claim 20, wherein forming the repeating pattern of features into the solder mask on the substrate comprises:

lithographically patterning the solder mask to form the repeating pattern therein, wherein the solder mask is formed from a light sensitive material.

24. The method of claim 23, wherein the light sensitive material comprises a photoresist or a photoimageable dielectric.

25. The method of claim 20, wherein forming the repeating pattern of features into the solder mask on the substrate comprises:

pressing a stamp into the solder mask, the stamp having the repeating pattern, wherein the repeating pattern is transferred into the solder mask.

* * * * *